(12) United States Patent
Deng et al.

(10) Patent No.: US 10,373,848 B2
(45) Date of Patent: Aug. 6, 2019

(54) METHOD OF PREPARING THE LED DISPLAY DEVICE

(71) Applicant: Shenzhen HOXLED Optoelectronic Technology Co., Ltd., Shenzhen (CN)

(72) Inventors: Jun Deng, Shenzhen (CN); Youfa Zhou, Shenzhen (CN)

(73) Assignee: SHENZHEN HOXLED OPTOELECTRONIC TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/965,976

(22) Filed: Apr. 30, 2018

(65) Prior Publication Data

US 2018/0247844 A1    Aug. 30, 2018

(30) Foreign Application Priority Data

May 5, 2017    (CN) .......................... 2017 1 0312123

(51) Int. Cl.

| H01L 21/67 | (2006.01) |
|---|---|
| H01L 25/075 | (2006.01) |
| H01L 33/52 | (2010.01) |
| B29C 45/14 | (2006.01) |
| B29C 45/57 | (2006.01) |
| H01L 33/54 | (2010.01) |
| H01L 33/56 | (2010.01) |
| B29K 63/00 | (2006.01) |
| B29L 31/34 | (2006.01) |

(52) U.S. Cl.
CPC .. *H01L 21/67126* (2013.01); *B29C 45/14065* (2013.01); *B29C 45/14639* (2013.01); *B29C 45/57* (2013.01); *H01L 25/0753* (2013.01); *H01L 33/52* (2013.01); *H01L 33/54* (2013.01); *H01L 33/56* (2013.01); *B29K 2063/00* (2013.01); *B29L 2031/3475* (2013.01); *H01L 2933/005* (2013.01); *H01L 2933/0091* (2013.01)

(58) Field of Classification Search
CPC ... H01L 21/67126; H01L 33/52; H01L 33/54; H01L 33/56; H01L 2933/005
See application file for complete search history.

(56) References Cited

U.S. PATENT DOCUMENTS

2013/0316487 A1* 11/2013 de Graff .......... H01L 27/14683
438/66

* cited by examiner

*Primary Examiner* — Hoai V Pham
(74) *Attorney, Agent, or Firm* — Shimokaji IP (57) ABSTRACT

An LED display device includes a substrate and an LED encapsulation unit disposed on a side of the substrate, the LED encapsulation unit includes an LED stent and an LED chip encapsulated in the LED stent, a epoxy resin encapsulates the side of the substrate on which the LED encapsulation unit is disposed and the LED encapsulation unit to form a protection layer shielding the LED encapsulation unit. The epoxy resin completely encapsulates the substrate and the LED encapsulation unit to protect effectively the substrate and the LED encapsulation unit, which is sufficient to resist severe environment. Compared with the prior art, the service life of the LED display device is effectively prolonged, cost is reduced. The invention also provides a molding module for preparing the LED display device, and a preparation method thereof.

4 Claims, 10 Drawing Sheets

METHOD OF PREPARING THE LED DISPLAY DEVICE

RELATED APPLICATIONS

This application claims the benefit of priority to Chinese Patent Application No. 201710312123.2, filed May 5, 2017, which is hereby incorporated by reference in its entirety.

FIELD OF THE INVENTION

The present invention relates to LED display, and more particularly to an LED display device, a molding module for preparing the LED display device, and preparation method thereof.

BACKGROUND OF THE INVENTION

The LED display device usually includes a substrate with control function and a plurality of LED encapsulation units arranged on the side of the substrate. In order to ensure display effect, the LED encapsulation unit usually has only less protection structure or even is naked. Bump caused by the handling of LED display devices during use and different climatic conditions (water vapor, acid and alkali, high and low temperatures, and ultraviolet rays) do some damage to the LED display device substrate and the bare LED encapsulation unit. At present, service life of LED display devices is usually only one year or even six months in relatively harsh environment, resulting in high cost and lack of market competitiveness.

Thus, there is a need to provide an LED display device with long service life and the wonderful display effect even if the LED display device suffers from collision, corrosion, moisture, or static electricity.

SUMMARY OF THE INVENTION

One objective of the present invention is to provide an LED display device which can prevent impact, corrosion, moisture or static electricity and also ensure display effect of the LED display device, so as to prolong service life of the LED display device and reduce cost.

To achieve the above objective, an LED display device is provided, which includes a substrate and an LED encapsulation unit disposed on a side of the substrate, the LED encapsulation unit includes an LED stent and an LED chip encapsulated in the LED stent, and a epoxy resin encapsulates the side of the substrate on which the LED encapsulation unit is disposed and the LED encapsulation unit to form a protection layer shielding the LED encapsulation unit.

In comparison with the prior art, the LED display device encapsulates the side of the substrate on which the LED encapsulation unit is disposed and the LED encapsulation unit by the epoxy resin, so that the substrate for achieving the control function and the LED encapsulation unit for realizing the display effect are completely encapsulated and isolated from the external environment, so as to achieve the purposes of anti-collision, anti-corrosion, moisture-proof and anti-static. Because the epoxy resin completely encapsulates the substrate and the LED encapsulation unit to form an effective protection for the substrate and the LED encapsulation unit, which is capable of resisting the severe environment, and the service life of the LED display device is effectively prolonged, cost is significantly reduced.

Preferably, the side wall of the protection layer protrudes 0.1~1 mm from the side wall of the substrate, and the protection layer made of the epoxy resin protrudes from the side wall of the substrate by 0.1~2 mm to effectively protect the side wall of the substrate and further resist side impact.

Preferably, the protection layer away from the upper wall of the substrate protrudes 0.2~0.3 mm above the upper surface of the LED encapsulation unit, which can completely shield the substrate and the LED encapsulation unit, further resist frontal impact.

Preferably, the upper surface of the protection layer away from the substrate is a frosted surface, to ensure the display effect and avoid reflecting light.

To achieve the above objective, the invention also provides a molding module for preparing the above-mentioned LED display device. The molding module includes a plate jig and a mold jig in a split structure, the plate jig is a flat structure whose size is larger than that of the substrate, the mold jig is a frame structure whose size is smaller than that of the plate jig and that of larger than the substrate, and the thickness of the mold jig is larger than the height of the LED encapsulation unit so that when the frame jig is placed on the plate jig, the frame and the flat plate form a receiving cavity for receiving the LED display device entirely.

According to the molding module, the plate jig and the mold jig in a split structure form a receiving cavity to be filled with liquid epoxy resin, and the side of the substrate on which the LED encapsulation unit is disposed is placed into the receiving cavity. When the liquid epoxy resin is cured to form a protection layer, because the size of the receiving cavity is larger than that of the substrate, and the depth of the receiving cavity is larger than the height of the LED encapsulation unit disposed on the substrate, thus the protection layer can completely encapsulates the substrate and the LED encapsulation unit to protect effectively the substrate and the LED encapsulation unit, so as to make the LED display device has better collision avoidance performance and weather resistance.

Preferably, the molding module further includes a release paper disposed between the plate jig and the mold jig, and the size of the release paper is larger than that of the mold jig. The release paper reduces the connection force between the protection layer and the molding module, so as to facilitate the LED display device to separate from the molding module.

Preferably, the molding module further includes a surface treatment jig disposed between the release paper and the mold jig, and the size of the surface treatment jig is larger than that of the mold jig, to make the protection layer to achieve a special effect and improve the display performance of the LED display device. Further, the surface treatment jig is frosted sticker.

Preferably, the molding module further includes a limited block for abutting against the substrate, to ensure the position of the substrate and the LED encapsulation unit before the liquid epoxy resin is completely cured, and further ensure the molding effect.

Concretely, the limited block has four, and the four limited blocks respectively abut against a side of the LED display device away from the LED encapsulation unit.

The present invention also provides a method of preparing the LED display device, and the method includes:

step a, providing a plate jig, laying a release paper on the plate jig, and the size of the plate jig and the release paper is larger than that of the substrate;

step b, placing a mold jig on the release paper making the mold jig and the release paper on the bottom form a receiving cavity; the mold jig has a frame structure whose size is smaller than that of the plate jig and larger than that of the substrate, and the thickness of the mold jig is larger than the height of the LED encapsulation unit disposed on the substrate;

step c, injecting the liquid epoxy resin in the receiving cavity, then vacuumizing;

step d, removing vacuum state after a side of the substrate on which the LED encapsulation unit is disposed is pressed into the receiving cavity; and step e, after the liquid epoxy resin is cured to form a protection layer, peeling off the plate jig, the release paper and the mold jig, and trimming the protection layer.

According to the method of preparing the LED display device, the substrate and the LED encapsulation unit disposed on the substrate are immersed in the liquid epoxy resin in a vacuum state, and the vacuum state is removed before the liquid epoxy resin is cured, so that the liquid epoxy resin sufficiently fills the gap between the substrate and the LED encapsulation unit and avoids bubbles, further the protection layer can protect fully the substrate and the LED encapsulation unit disposed on the substrate, but not to produce a significant effect on the display effect of the LED display device.

Preferably, before the step c, the plate jig, the release paper, the mold jig, and the liquid epoxy resin are placed in the receiving cavity, then the receiving cavity is vacuumed until the vacuum degree of the receiving cavity reaches 0.098 Mpa~0.1 Mpa. After the receiving cavity is vacuumed, the pressure in the receiving cavity is below atmospheric pressure, so air in the liquid epoxy resin is mostly extracted.

Preferably, between the steps a and b, a surface treatment jig is placed on the release paper, and the size of the surface treatment jig is larger than that of the mold jig.

Preferably, between the steps d and e, a limited block is placed on an upper side of the substrate away from the LED encapsulation unit for limiting the substrate.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Various preferred embodiments of the invention will now be described with reference to the figures, wherein like reference numerals designate similar parts throughout the various views.

Figure 1:
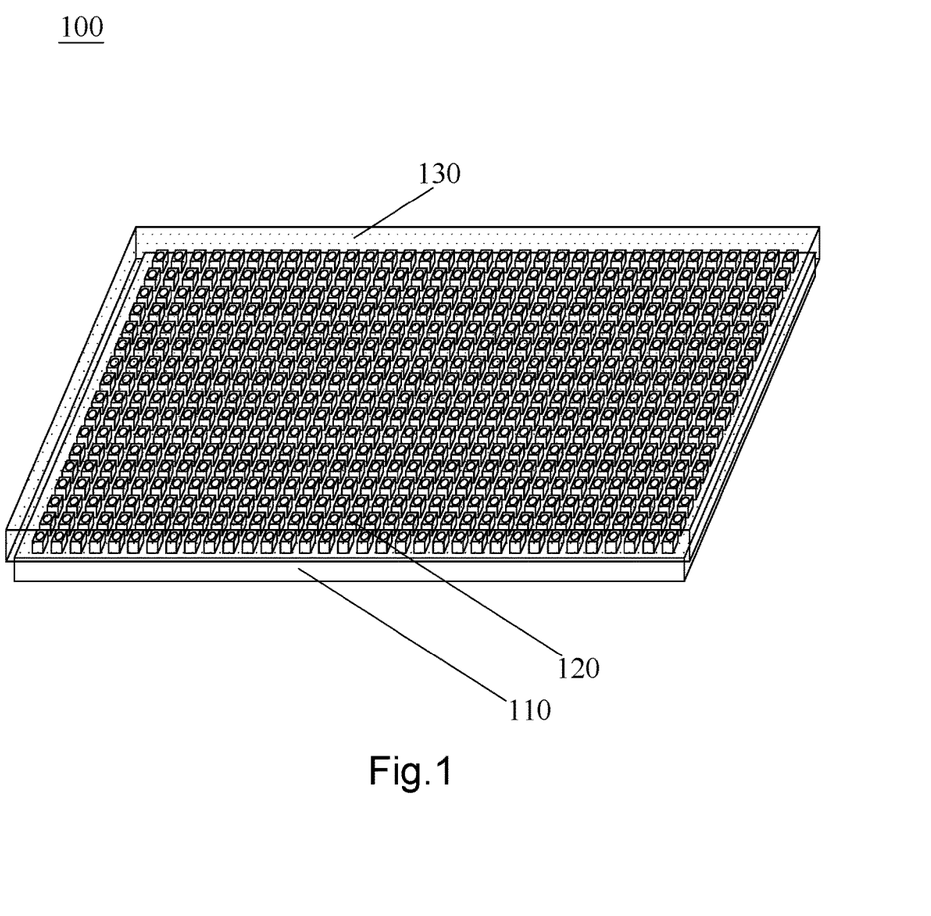
FIG. 1 is a perspective view of a LED display device of the present invention.
Figure 2:
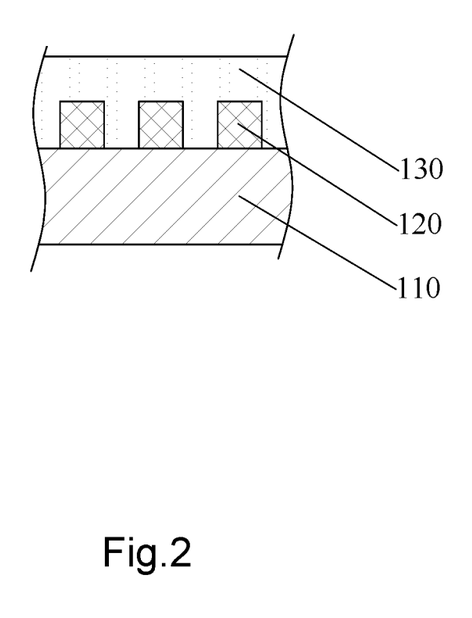
FIG. 2 is a partial cross-section view of FIG. 1.

Referring to FIGS. 1 and 2, an LED display device 100 includes a substrate 110 and an LED encapsulation unit 120 disposed on a side of the substrate 110, the LED encapsulation unit 120 includes an LED stent and an LED chip encapsulated in the LED stent, and a epoxy resin encapsulates the side of the substrate 110 on which the LED encapsulation unit 120 is disposed and the LED encapsulation unit 120 to form a protection layer 130 shielding the LED encapsulation unit 120. More specifically, As shown in FIGS. 1 and 2, the LED display device 100 includes the substrate 110, the LED encapsulation unit 120, and the protection layer 130. The substrate 110 is usually a flat plate-like structure. Concretely, the substrate 110 is a PCB circuit board with integrated control circuit. The substrate 110 may further is integrated with a power module or an IC control module, and so on, to achieve the control function of the LED display device 100. Of course, the power module and the IC control module may also be separately set and electrically connected to the substrate 110. The LED encapsulation unit 120 may be an ordinary LED encapsulation module, which includes an LED stent, an LED chip encapsulated in the LED stent, and a protection layer made of epoxy resin for positioning the LED chip to the LED stent. A plurality of LED encapsulation units 120 are arranged in a matrix on one side of the substrate 110, and the LED stents of the LED encapsulation units 120 are respectively soldered to the substrate 110 to achieve power supply and control of the LED encapsulation units 120. The protection layer 130 is disposed on the side of the substrate 110 where the LED encapsulation unit 120 is disposed, and the protection layer 130 completely covers the side of the substrate 110 and a plurality of LED encapsulation units 120 disposed on the side of the substrate 110. So the plurality of LED encapsulation units 120 disposed on the substrate 110 are isolated from the outside, so as to fully protect the substrate 110 and the plurality of LED encapsulation units 120 disposed on the substrate 110, thereby prolonging service life of the LED display device 100 and reducing cost.

Preferably, the protection layer 130 is made of transparent epoxy resin. The transparent epoxy resin infiltrates into the side of the substrate 110 where the LED encapsulation unit 120 is disposed and a plurality of LED encapsulation units 120 to fully fill the gap between the plurality of LED encapsulation units 120 and the substrate 110. The LED encapsulation unit 120 and the substrate 110 are insulated from the external environment to improve the weather resistance of the LED display device 100. The size of the protection layer 130 made of the transparent epoxy resin is larger than that of the substrate 110 to protect the LED encapsulation unit 120 and the substrate 110 to further improve the anti-impact performance of the LED display device 100.

Specifically, the shape of the protection layer 130 is similar to that of the substrate 110, and the size of the protection layer 130 is larger than that of the substrate 110. Preferably, the side wall of the protection layer 130 made of transparent epoxy resin protrudes 0.1~1 mm from the side wall of the substrate 110, to effectively protect the side wall of the substrate 110 and further resist side impact. Preferably, the protection layer 130 has a certain thickness, and the protection layer 130 away from the upper wall of the substrate 110 protrudes 0.2~0.3 mm above the upper surface of the LED encapsulation unit 120, which can completely shield the substrate 110 and the LED encapsulation unit 120, further resist frontal impact.

Based on the above, it can be understood that the LED display device 100 provided with the protection layer 130 has a shape similar to that of the substrate 110 and has a certain thickness. Specifically, in the present embodiment, the LED display device 100 encapsulated by the protection layer 130 is approximately a plate-like cubic structure. The light emitted by the LED encapsulation unit 120 passes through the transparent protection layer 130, thereby achieving the display effect of the LED display device 100.

Further, the upper surface of the protection layer 130 away from the substrate 110 is a frosted surface to improve the display performance of the LED display device 100 and avoid reflections.

The LED display device 100 encapsulates the side of the substrate on which the LED encapsulation unit 120 is disposed and the LED encapsulation unit 120 by the epoxy resin, so that the substrate 110 for achieving the control function and the LED encapsulation unit 120 for realizing the display effect are completely encapsulated and isolated from the external environment, so as to achieve the purposes of anti-collision, anti-corrosion, moisture-proof and anti-static. Because the epoxy resin completely encapsulates the substrate 110 and the LED encapsulation unit 120 to form an effective protection for the substrate 110 and the LED encapsulation unit 120, which is capable of resisting the severe environment, and the service life of the LED display device 100 is effectively prolonged, cost is significantly reduced.

Figure 3:
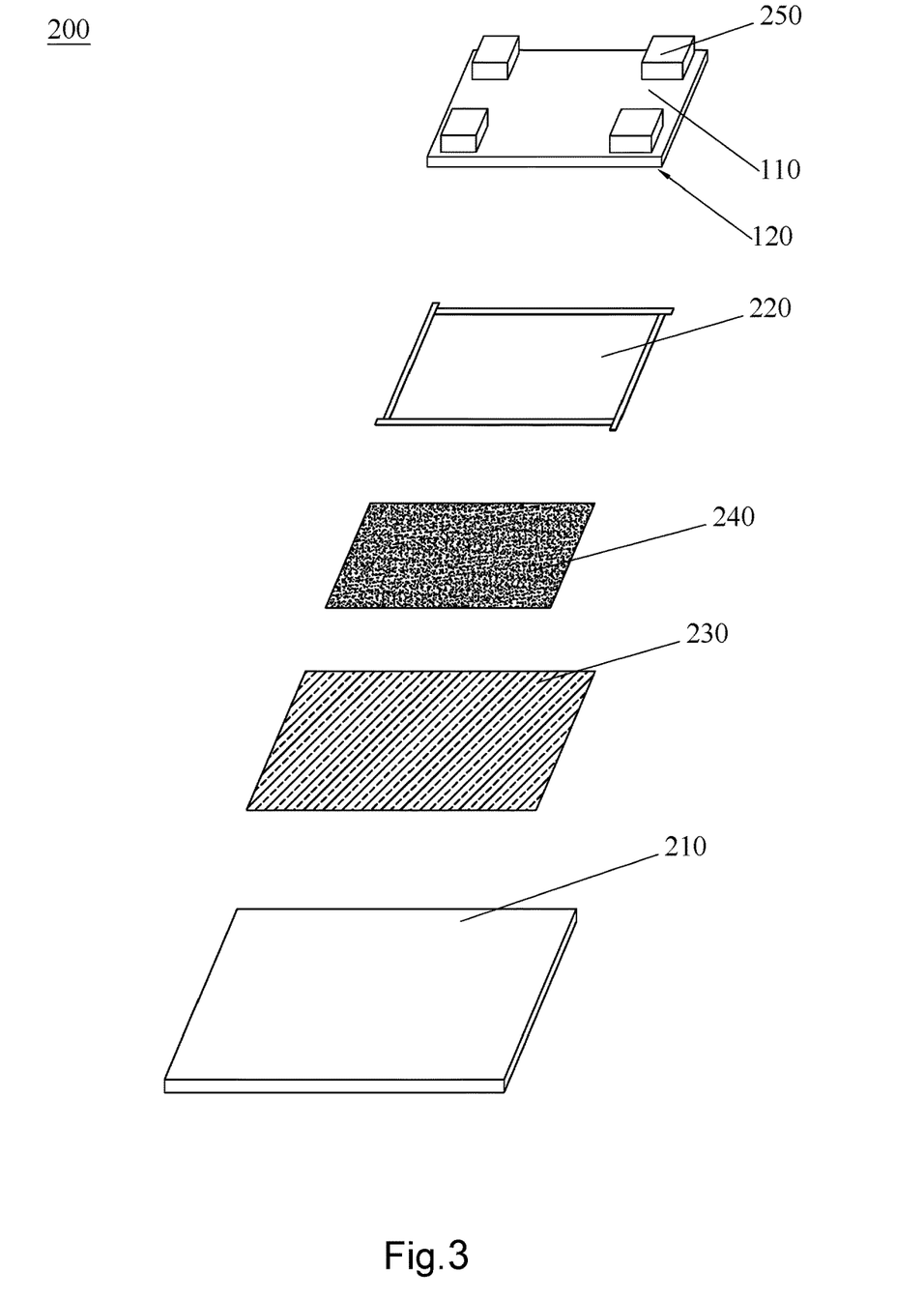
FIG. 3 is an exploded view of a molding module of the present invention.
Figure 4:
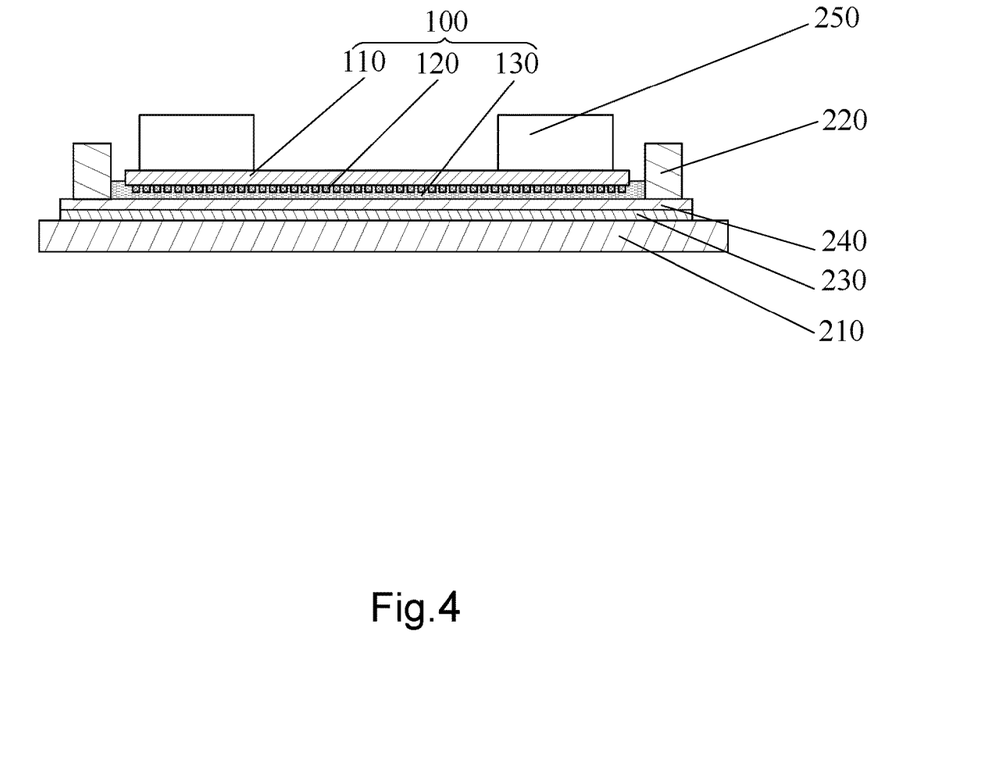
FIG. 4 is a cross-section view of the LED display device during preparation thereof.

As shown in FIG. 3, the molding module 200 for preparing the LED display device 100 includes a plate jig 210 and a mold jig 220. The plate jig 210 has a plate-like structure whose size is larger than that of the substrate 110. The mold jig 220 has a frame structure whose size is smaller than that of the plate jig 210 and larger than that of the substrate 110, and the thickness of the mold jig 220 is larger than the height of the LED encapsulation unit 120 disposed on the substrate 110. Referring to FIG. 4, more specifically:

As shown in FIG. 3, the molding module 200 includes a plate jig 210, a mold jig 220, a release paper 230, and a surface treatment jig 240. The plate jig 210 has a plate-like structure, and the size of the plate jig 210 is larger than that of the substrate 110. Preferably, the shape of the plate jig 210 is similar to that of the substrate 110, the mold jig 220 has a frame structure whose size is smaller than that of the plate jig 210 and larger than that of the substrate 110, and the thickness of the mold jig 220 is larger than the height of the LED encapsulation unit 120 disposed on the substrate 110. Specifically, the mold jig 220 is formed by splicing a plurality of rods in the same plane, the release paper 230 has a sheet structure, the size of the release paper 230 is larger than that of the mold jig 220, and the release paper 230 is placed between the plate jig 210 and the mold jig 220, to demold easily. The surface treatment jig 240 also has a sheet structure, and the size of the surface treatment jig 240 is also larger than that of the mold jig 220, and the surface treatment jig 240 is placed between the release paper 230 and the mold jig 220 to achieve a special effect of encapsulating the protection layer 130.

Referring to FIGS. 1-4, the plate jig 210, the release paper 230, the surface treatment jig 240, and the mold jig 220 are placed in order. The release paper 230 and the surface treatment jig 240 respectively cover the bottom surface of the mold jig 220, forming a receiving cavity by the inner wall of the mold jig 220 and the bottom wall of the plate jig 210, the release paper 230, and the surface treatment jig 240, which fills liquid transparent epoxy resin. After the side of the substrate 110 where the LED encapsulation unit 120 is disposed and the portion of the substrate 110 are pressed into the receiving cavity, and the position of the substrate 110 and the LED encapsulation unit 120 is kept, so that the liquid transparent epoxy resin infiltrates and fills the gap between the substrate 110 and the LED encapsulation unit 120. After the liquid transparent epoxy resin in the receiving cavity is completely cured to form the protection layer 130, the plate jig 210, the release paper 230, the surface treatment jig 240, and the mold jig 220 are removed in sequence. The substrate 110 and the LED encapsulation unit 120 disposed on the substrate 110 are completely encapsulated by the transparent protection layer 130 to protect the LED encapsulation unit 120 and the substrate 110, thereby prolonging the service life of the LED display device 100 and reducing cost.

Specifically, the surface treatment jig 240 is provided to make the protection layer 130 to achieve a special effect and improve the display performance of the LED display device 100. Further, the surface treatment jig 240 is a frosted sticker.

Preferably, both sides of the plate jig 210 and the release paper 230 are opposite to each other, at least one of which should be non-mirrored, have a certain roughness, and its roughness Ra is higher than 1.6 μm. In the present embodiment, because the release paper 230 is relatively smooth, the side of the plate jig 210 facing the release paper 230 is set to a rough surface with surface roughness Ra higher than 1.6 μm. The rough surface is provided for extracting the gas between the plate jig 210 and the release paper 230 during vacuuming.

Similarly, both sides of the release paper 230 and the surface treatment jig 240 are opposite to each other, at least one of which should be non-mirrored, have a certain roughness, and its roughness Ra is higher than 1.6 μm. In the present embodiment, because the release paper 230 is relatively smooth, the side of the surface treatment jig 240 is set to a rough surface with surface roughness Ra higher than 1.6 μm. Preferably, the molding module 200 further includes a limited block 250 for pressing against the LED display device 100, to maintain the position of the substrate 110 and the LED encapsulation unit 120 before the liquid epoxy resin is completely cured, and further ensure the molding effect. The limited block 250 has four, and the four limited blocks 250 respectively press against the side of the LED display device 100 away from the LED encapsulation unit 120.

According to the molding module 200, the plate jig 210 and the mold jig 220 in a split structure form the receiving cavity to be filled with liquid epoxy resin, and the side of the substrate 110 on which the LED encapsulation unit 120 is disposed is placed into the receiving cavity. When the liquid epoxy resin is cured to form the protection layer 130, because the size of the receiving cavity is larger than that of the substrate 110, and the depth of receiving cavity is larger than the height of the LED encapsulation unit 120 disposed on the substrate 110, the protection layer 130 completely encapsulates the substrate 110 and the LED encapsulation unit 120 to protect effectively the substrate 110 and the LED encapsulation unit 120, so as to make the LED display device 100 and the molding module 200 achieve better collision avoidance performance and weather resistance.

Referring to FIGS. 1-10, a method of preparing the LED display device 100 using the molding module 200 abovementioned includes:

step a, providing a plate jig 210, and laying a release paper 230 on the plate jig 210, and steps c-e below.

Figure 5:
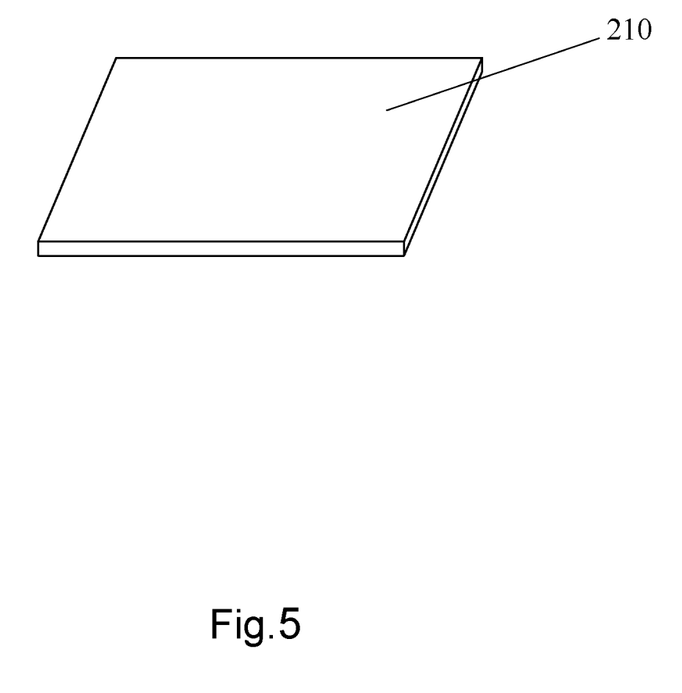
FIG. 5-10 is a perspective view to show the method of preparing the LED display device according to one embodiment of the present invention.
Figure 6:
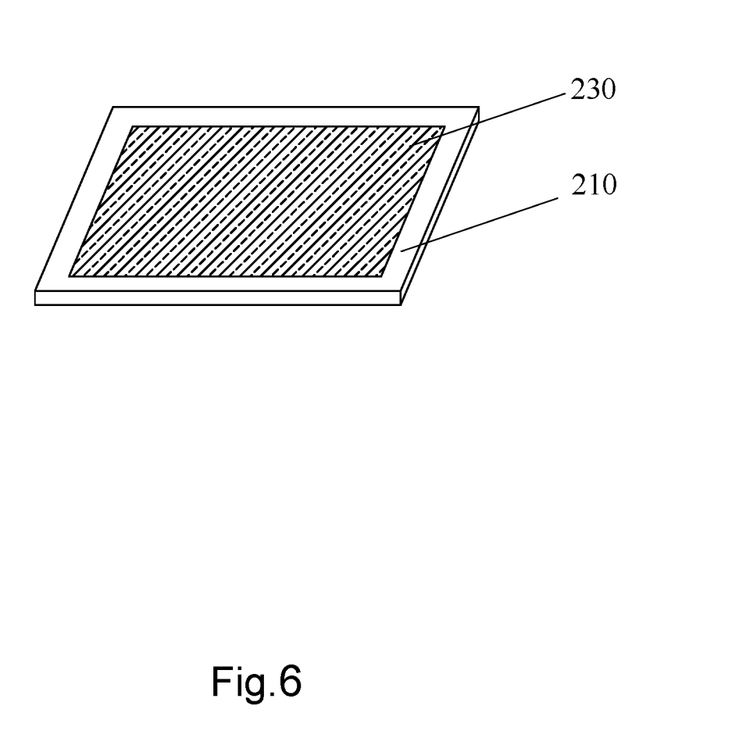

Concretely, as shown in FIGS. 5 and 6, the plate jig 210 has a plate-like structure, and the size of the plate jig 210 is larger than that of the substrate 110. Preferably, the shape of the plate jig 210 is similar to that of the substrate 110. The plate jig 210 is horizontally placed on a working table, and the release paper 230 is laid on the upper side of the plate jig 210.

Step b includes placing a mold jig 220 on the release paper 230 making the mold jig 220 and the release paper 230 on the bottom form a receiving cavity, the mold jig 220 has a frame structure whose size is smaller than that of the plate jig 210 and larger than that of the substrate 110, and the thickness of the mold jig 220 is larger than the height of the LED encapsulation unit 120 disposed on the substrate 110.

Figure 8:
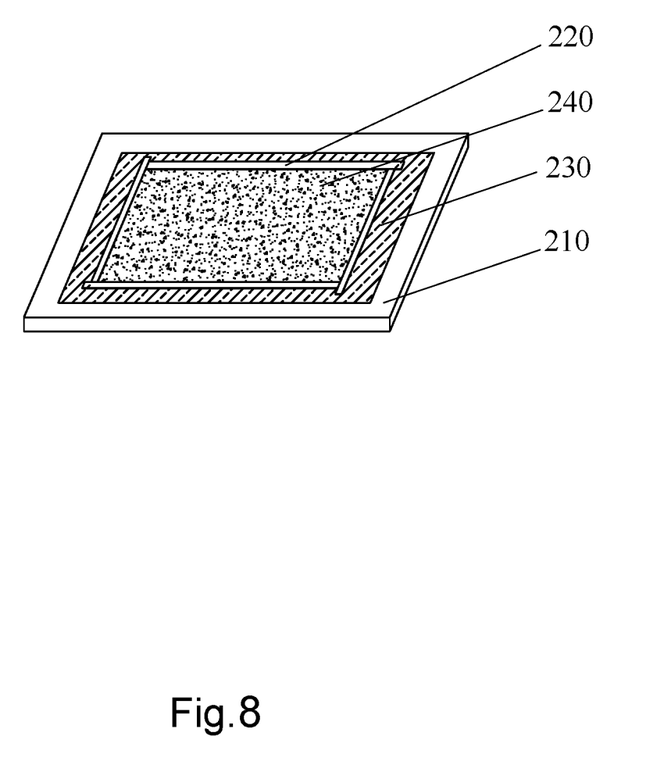

Concretely, as shown in FIG. 8, the mold jig 220 is a frame fixture which is similar to the shape of the substrate 110, the length and width of the mold jig 220 is larger than the length and width of the substrate 110 by 0.5~2 mm, and the height of the mold jig 220 is higher than the height of the LED encapsulation unit 120 disposed on the substrate 110 by 0.2~0.3 mm.

Step c includes injecting the liquid epoxy resin in the receiving cavity, then vacuumizing.

Specifically, as shown in FIG. 8, before the step c, the plate jig 210, the release paper 230, the mold jig 220, and the liquid transparent epoxy resin in the receiving cavity are placed in the enclosed space, then to vacuumize until the vacuum degree of the receiving cavity reaches 0.098 Mpa~0.1 Mpa. After the receiving cavity is vacuumed, the pressure in the receiving cavity is below atmospheric pressure, so air in the liquid epoxy resin is mostly extracted. It can be understood that the plate jig 210, the release paper 230, the mold jig 220, and the liquid transparent epoxy resin 130 in the receiving cavity can be placed in the enclosed space at any time before vacuuming. As long as it is guaranteed that the plate jig 210, the release paper 230, the mold jig 220, and the liquid transparent epoxy resin in the receiving cavity are in a closed space during vacuuming, and vacuum can be preformed.

Step d includes removing vacuum state after the side of the substrate 110 on which the LED encapsulation unit 120 is disposed is pressed into the receiving cavity.

Figure 9:
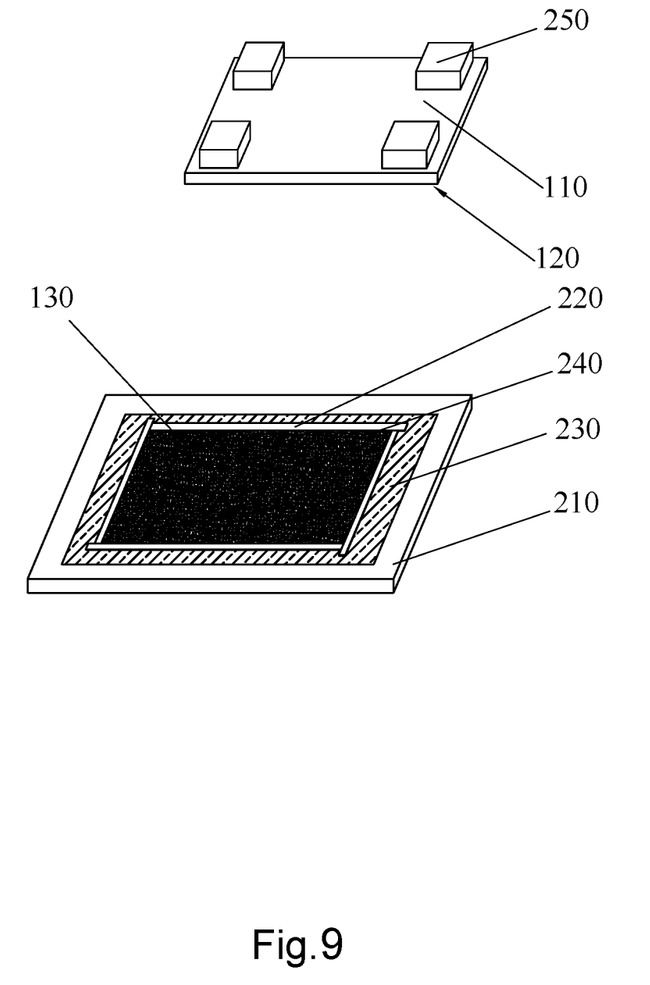
Figure 10:
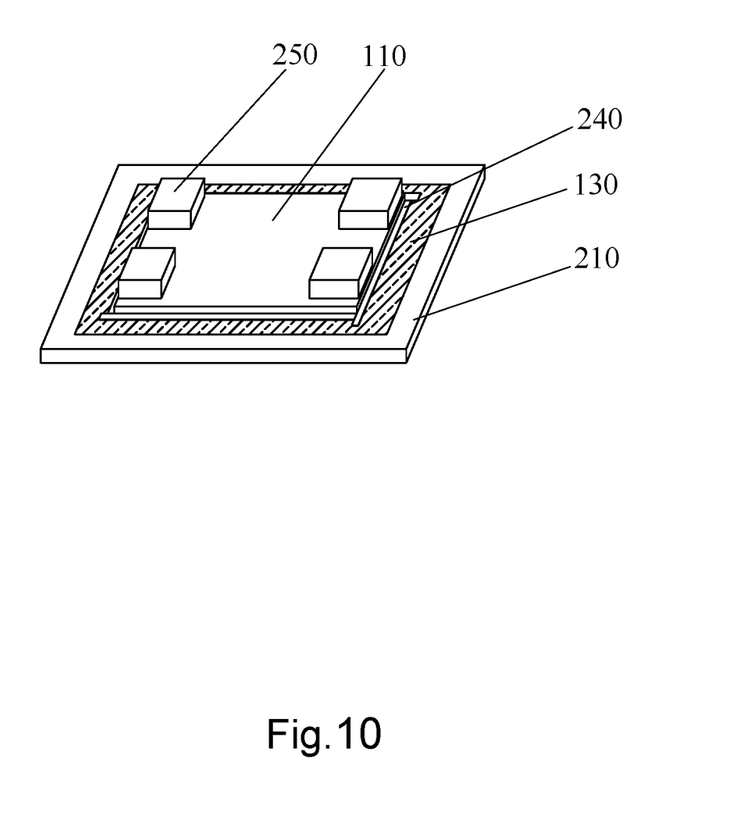

Concretely, as shown in FIGS. 9 and 10, after the vacuum state is removed, the liquid epoxy resin sufficiently fills the gap between the substrate 110 and the LED encapsulation unit 120, thereby avoiding bubbles.

Step e includes, after the liquid epoxy resin is cured to form a protection layer 130, peeling off the plate jig 210, the release paper 230 and the mold jig 220, and trimming the protection layer 130. Due to the release paper 230, the plate jig 210 and the protection layer 130 can be easily detached.

Figure 7:
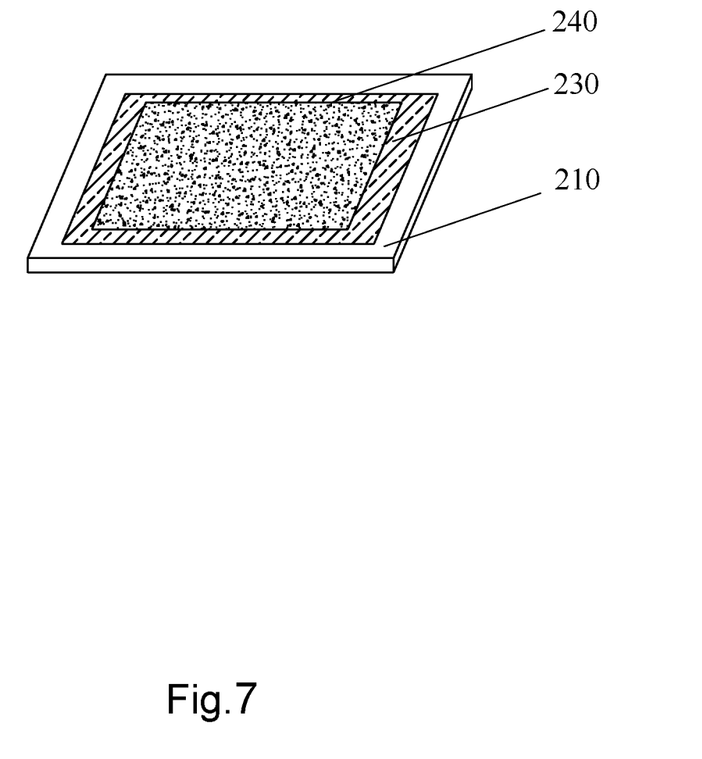

Preferably, as shown in FIG. 7, between the steps a and b, a surface treatment jig 240 is placed on the upper side of the release paper 230, and the size of the surface treatment jig 240 is larger than that of the mold jig 220 to make the protection layer 130 to achieve a special effect and improve the display performance of the LED display device 100. Further, the surface treatment jig 240 is a frosted sticker to improve the display performance of the LED display device 100 and avoid reflections.

It can be understood that, because of the surface roughness of the surface treatment jig 240, the gas between the release paper 230 and the surface treatment jig 240 is completely extracted by vacuumizing, which will not affect the subsequent curing molding of the liquid transparent epoxy resin.

Preferably, between the steps d and e, a limited block 250 is placed on the upper side of the substrate 110 away from the LED encapsulation unit 120 for limiting the substrate 110. The limited block 250 is abutted against the substrate 110, to ensure the position of the substrate 110 and the LED encapsulation unit 120 before the liquid epoxy resin is completely cured, and further ensure the molding effect. Concretely, the limited block 250 has four, and the four limited blocks 250 respectively abut against a side of the LED display device away from the LED encapsulation unit.

According to the method of preparing the LED display device 100, the substrate 110 and the LED encapsulation unit 120 disposed on the substrate 110 are immersed in the liquid epoxy resin in a vacuum state, and the vacuum state is removed before the liquid epoxy resin is cured, so that the liquid epoxy resin sufficiently fills the gap between the substrate 110 and the LED encapsulation unit 120, and bubbles are avoided, so that the protection layer 130 can protect fully the substrate 110 and the LED encapsulation unit 120 disposed on the substrate 110, but not to produce a significant effect on the display effect of the LED display device 100.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method of preparing the LED display device, comprising:
   step a, providing a plate jig and a substrate having LED encapsulation units, laying a release paper on the plate jig, and the size of the plate jig and the release paper is larger than that of the substrate;
   step b, placing a mold jig on the release paper making the mold jig and the release paper on the bottom form a receiving cavity; the mold jig has a frame structure whose size is smaller than that of the plate jig and larger than that of the substrate, and the thickness of the mold jig is larger than the height of the LED encapsulation unit disposed on the substrate;
   step c, injecting liquid epoxy resin in the receiving cavity, then vacuumizing;
   step d, removing the vacuum state after a side of the substrate on which the LED encapsulation unit is disposed is pressed into the receiving cavity; and
   step e, after the liquid epoxy resin is cured to form a protection layer, peeling off the plate jig, the release paper and the mold jig, and trimming the protection layer.

2. The method of preparing the LED display device according to claim 1, before the step c, further comprising placing the plate jig, the release paper, the mold jig, and the liquid epoxy resin in the receiving cavity, then vacuumizing the receiving cavity until the vacuum degree in the receiving cavity reaches 0.098 Mpa~0.1 Mpa.

3. The method of preparing the LED display device according to claim 1, between the steps a and b, further comprising placing a surface treatment jig on the release paper, and the size of the surface treatment jig is larger than that of the mold jig.

4. The method of preparing the LED display device according to claim 1, between the steps d and e, further comprising providing a limited block on a upper side of the substrate away from the LED encapsulation unit for limiting the substrate.

* * * * *